(12) United States Patent
Yakuwa (10) Patent No.: US 7,872,354 B2
(45) Date of Patent: Jan. 18, 2011

(54) HIGH VOLTAGE-RESISTANT SEMICONDUCTOR DEVICE AND METHOD OF MANUFACTURING HIGH VOLTAGE-RESISTANT SEMICONDUCTOR DEVICE

(75) Inventor: Tomohiro Yakuwa, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 96 days.

(21) Appl. No.: 12/403,619

(22) Filed: Mar. 13, 2009

(65) Prior Publication Data

US 2009/0236671 A1 Sep. 24, 2009

(30) Foreign Application Priority Data

Mar. 21, 2008 (JP) ............................. 2008-073454

(51) Int. Cl.
- *H01L 27/04* (2006.01)
- *H01L 23/48* (2006.01)
- *H01L 29/78* (2006.01)

(52) U.S. Cl. .................. 257/775; 257/773; 257/774

(58) Field of Classification Search ................. 257/775, 257/331–335, 344, 773, 774
See application file for complete search history.

(56) References Cited

U.S. PATENT DOCUMENTS

| 6,917,075 B2 * | 7/2005 | Inoue et al. ............... 257/331 |
| 2009/0014796 A1 * | 1/2009 | Liaw ....................... 257/347 |

FOREIGN PATENT DOCUMENTS

| JP | 09-036061 | 2/1997 |
| JP | 2005-038958 | 2/2005 |
| JP | 2009-231443 | 10/2009 |

* cited by examiner

*Primary Examiner*—Thanh V Pham
*Assistant Examiner*—Errol Fernandes
(74) *Attorney, Agent, or Firm*—Taft Stettinius & Hollister LLP (57) ABSTRACT

High voltage-resistant semiconductor devices adapted to control threshold voltage by utilizing threshold voltage variation caused by plasma damage resulting from the formation of multilayer wiring, and a manufacturing method thereof. Exemplary high voltage-resistant semiconductor devices include a plurality of MOS transistors having gate insulating films not less than about 350 Å in thickness on a silicon substrate, and the MOS transistors have different area ratios between gate electrode-gate insulating film contact areas and total opening areas of contacts formed on the gate electrodes.

15 Claims, 5 Drawing Sheets

HIGH VOLTAGE-RESISTANT SEMICONDUCTOR DEVICE AND METHOD OF MANUFACTURING HIGH VOLTAGE-RESISTANT SEMICONDUCTOR DEVICE

CROSS REFERENCE TO RELATED APPLICATION

This application claims the benefit of Japanese Patent Application No. 2008-073454, filed Mar. 21, 2008, which is incorporated by reference.

BACKGROUND

The present disclosure relates to high voltage-resistant semiconductor devices and methods of manufacturing high voltage-resistant semiconductor devices. In particular, the present disclosure relates to high voltage-resistant semiconductor devices into which a plurality of transistors is integrated and methods of manufacturing such high voltage-resistant semiconductor devices.

In recent years, semiconductor devices such as a LSI (large scale integration) systems placing together a digital circuit and an analog circuit on one chip have been put to practical use. In these semiconductor devices, since digital circuits (in which a reduction of leak currents during non-conduction is a consideration) and analog circuits (in which current driving capability is a consideration) are placed together, the threshold voltage (Vt) at which a transistor starts to become conductive may be changed.

Methods for adjusting the threshold voltage include adjusting the impurity concentration of a channel region (a diffusion region) in a transistor, adjusting a distance between a channel layer and a gate electrode (for example, see Japanese Patent Application Laid-Open No. 1997-36061, which is incorporated by reference), and adjusting the gate length of a transistor (for example, see Japanese Patent Application Laid-Open No. 2005-38958, which is incorporated by reference).

In addition, Japanese Patent Application No. 2006-305991 (incorporated by reference) discloses that a diode may be separately provided in order to restrain a variation of the Vt caused by plasma damage to the gate insulating film. However, in that device, all transistors have the same degree of Vt, and a semiconductor device having transistors showing different Vts is not assumed.

SUMMARY

Exemplary embodiments described herein provide high voltage-resistant semiconductor devices adapted to control threshold voltage by utilizing threshold voltage variation. Exemplary high voltage-resistant semiconductor devices may include a plurality of MOS (metal oxide semiconductor) transistors having gate insulating films not less than about 350 Å in thickness on a silicon substrate, and the MOS transistors may have different area ratios between (a) gate electrode-gate insulating film contact areas and (b) total opening areas of contacts formed on the gate electrodes.

In an aspect, a high voltage-resistant semiconductor device may include a plurality of metal-oxide-semiconductor transistors on a silicon substrate, each of the transistors including (a) a gate insulating film having a thickness greater than about 350 Å, (b) at least one gate electrode over the gate insulating film, and (c) at least one contact formed over the at least one gate electrode. A respective area ratio, Sc/Sg, may be associated with each of the transistors, where Sc is a total opening area of the contact formed on the gate electrode of the respective transistor when viewed from a gate electrode side of the respective transistor, and where Sg is a contact area between the gate electrode and the gate insulating film of the respective transistor. At least two of the transistors may be associated with different area ratios.

In a detailed embodiment, a difference between the area ratio, Sc/Sg, associated with each of the transistors and an average of all of the area ratios, Sc/Sg, associated with all of the transistors may exceed about 10%. In a detailed embodiment, at least one of the contacts formed over the gate electrode may have a shape substantially similar to at least one of a source contact formed on a source region and a drain contact formed on a drain region. In a detailed embodiment, at least one of the contacts may have a cross-sectional area of less than about 0.16 µm$^2$. In a detailed embodiment, the gate insulating film may include at least one of $SiO_2$ and an oxynitride. In a detailed embodiment, at least one of the gate electrodes may include at least one of poly-Si, WSiX, and W. In a detailed embodiment, at least one of the contacts may include at least one of poly-Si, Al, W, and Cu. In a detailed embodiment, a high voltage-resistant semiconductor device may include a wire including at least one of an Al—Cu alloy, Al—Cu—Si, and Cu, and an intermediate film including $SiO_2$.

In an aspect, a method for manufacturing a high voltage-resistant semiconductor device may include preparing a silicon substrate having a plurality of transistor forming regions; forming a plurality of transistors by forming channel regions in a superficial layer region on the transistor forming regions of the semiconductor substrate, forming gate insulating films having film thicknesses greater than about 350 Å on the channel regions, forming gate electrodes on the gate insulating films, and forming source regions and drain regions on both sides of the channel regions; providing contacts on the gate electrodes of the plurality of transistors; and providing multilayer wiring on the contacts. An area ratio, Sc/Sg, associated with each of the transistors may differs from area ratios, Sc/Sg, associated with the other of the transistors, where Sc is a total opening area of the contacts provided on the gate electrodes of the respective transistor when viewed from a gate electrode side of the respective transistor, and where Sg is a contact area between the gate electrodes and the gate insulating film of the respective transistor.

In a detailed embodiment, a difference between the area ratio, Sc/Sg, associated with each of the transistors and an average of all of the area ratios, Sc/Sg, associated with all of the transistors may exceed about 10%. In a detailed embodiment, the action of providing contacts may include forming a contact hole by plasma etching using an etching gas including at least one of $CF_4$, $C_4F_8$, $C_5F_8$, and $CHF_3$. In a detailed embodiment, the action of providing contacts may include covering at least one of the plurality of transistors with an intermediate film, applying a mask, forming a contact hole, removing the mask, and filling the contact hole with a contact material. In a detailed embodiment, the action of providing multilayer wiring may include forming a first wiring layer over at least one of the contacts, covering the first wiring layer with a first interlayer film, forming a first via in the first interlayer film, and forming a second wiring layer over the first via.

In an aspect, a high voltage-resistant semiconductor device may include a plurality of metal-oxide-semiconductor transistors on a silicon substrate, each of the plurality of transistors including (a) a gate insulating film having a thickness greater than a thickness of the gate insulating film in which a threshold voltage variation amount substantially increases with respect to lower thicknesses, (b) at least one gate electrode over the gate insulating film, and (c) at least one contact formed over the at least one gate electrode. A respective area ratio, Sc/Sg, may be associated with each of the plurality of transistors, where Sc is a total opening area of the at least one contact formed on the at least one gate electrode of the respective transistor when viewed from a gate electrode side of the respective transistor, and where Sg is a contact area between the at least one gate electrode and the gate insulating film of the respective transistor. At least two of the transistors may be associated with different area ratios.

In a detailed embodiment, a difference between the area ratio, Sc/Sg, associated with each of the transistors and an average of all of the area ratios, Sc/Sg, associated with all of the transistors may exceed about 10%. In a detailed embodiment, at least one of the contacts formed over the gate electrode may have a shape substantially similar to at least one of a source contact formed on a source region and a drain contact formed on a drain region. In a detailed embodiment, at least one of the contacts may have a cross-sectional area of less than about 0.16 μm². In a detailed embodiment, the gate insulating film may include at least one of $SiO_2$ and an oxynitride. In a detailed embodiment, at least one of the gate electrodes may include at least one of poly-Si, WSiX, and W. In a detailed embodiment, at least one of the contacts may include at least one of poly-Si, Al, W, and Cu. In a detailed embodiment, a high voltage-resistant semiconductor device of claim 14, may include a wire including at least one of an Al—Cu alloy, Al—Cu—Si, and Cu, and an intermediate film including $SiO_2$. In a detailed embodiment, the thickness of the gate insulating film may be greater than about 350 Å.

BRIEF DESCRIPTION OF THE DRAWINGS

The detailed description refers to the following figures in which.

DETAILED DESCRIPTION

Exemplary embodiments are described below with reference to the drawings. However, it is to be understood that the present disclosure is not limited to the depicted exemplary embodiments; the drawings merely depict exemplary configurations, sizes, and arrangements of various elements for purposes of explanation. In addition, in the following description, any specific material, condition, numeric value, etc., is merely exemplary, and the present disclosure is not limited to such examples.

The present disclosure contemplates that it has been difficult to control Vt using conventional methods. For example, the present disclosure contemplates that, in the method of adjusting the impurity concentration of the diffusion region discussed above, it may be difficult to reach a desired threshold value because the impurity concentration is distributed in a film thickness direction of the channel region even if impurities are doped. Moreover, the process for doping impurities may result in an increase in TAT (turn-around time, a manufacturing process time) and an increase in process costs.

Figure 3:
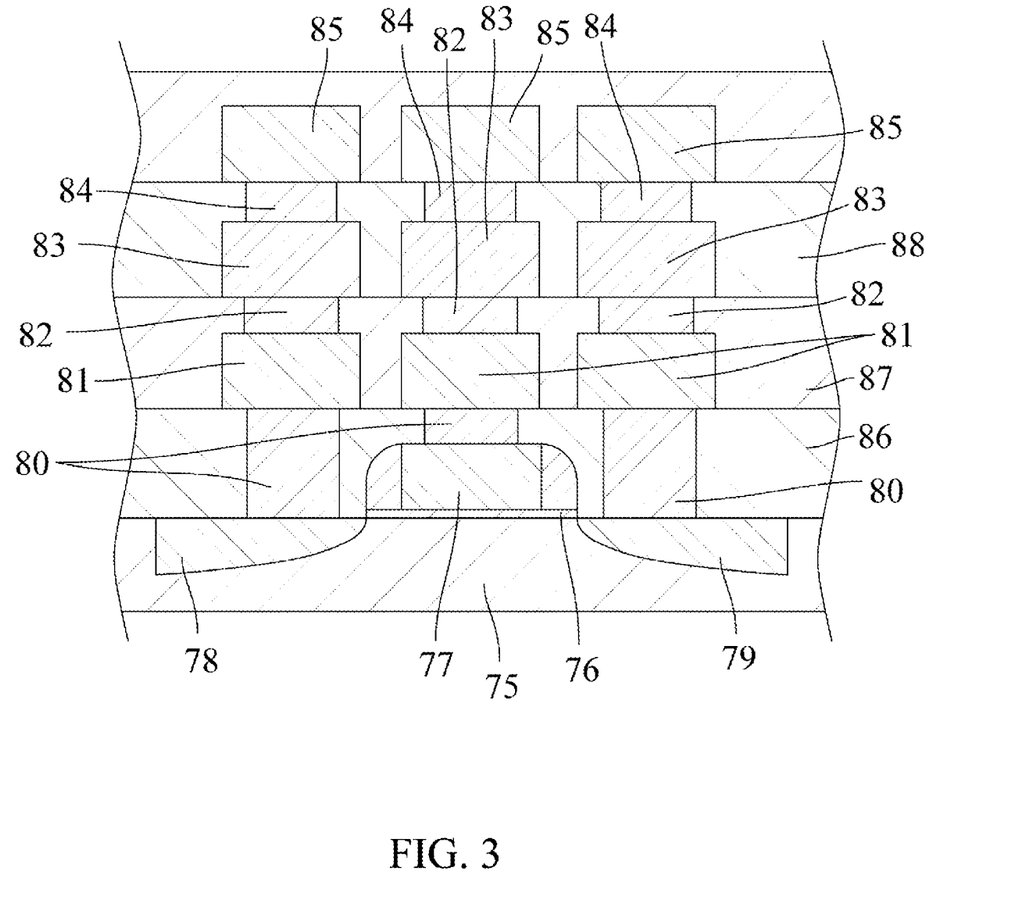
FIG. 3 is a partial cross-sectional view illustrating an exemplary high voltage-resistant semiconductor device.
Figure 4:
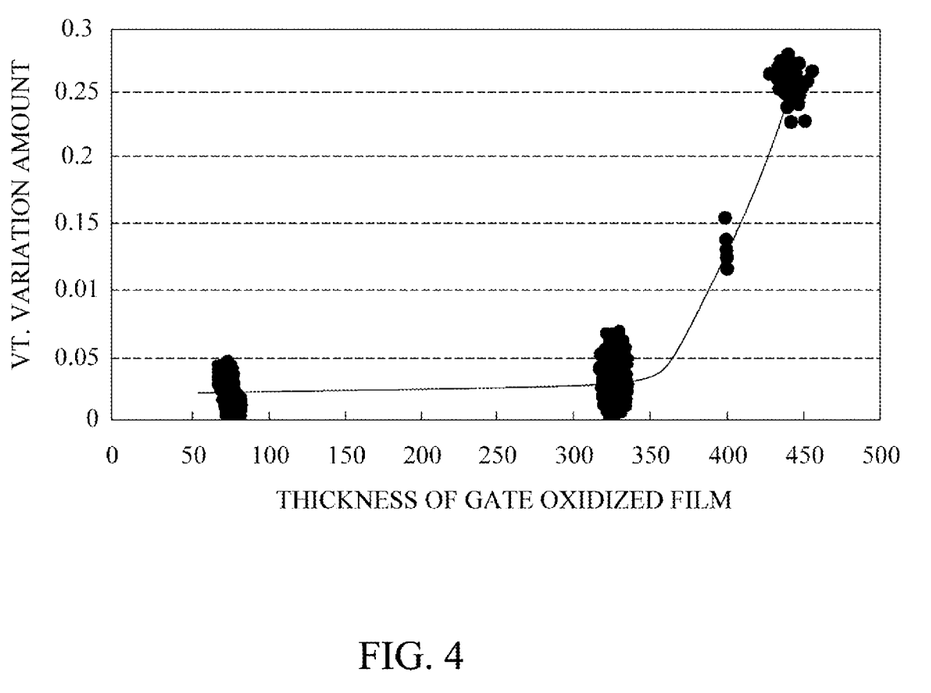
FIG. 4 is a plot of threshold voltage variation versus gate-insulating-film thickness in the exemplary high voltage-resistant semiconductor device of FIG. 3.

The present disclosure also contemplates that, as the thickness of the gate insulating film increases, a variation amount of Vt increases suddenly at around 350 Å of film thickness. FIG. 3 illustrates an exemplary structure of a high voltage-resistant semiconductor device having a multilayer wiring substrate. A gate insulating film 76 and a gate electrode 77 are formed on a semiconductor substrate 75, and a source region 78 and a drain region 79 are formed in a superficial layer region of the semiconductor substrate 75 on both sides of the gate electrode 77. The source region 78, the drain region 79, and the gate electrode 77 are connected to a first metal wire 81 via a contact 80. The first metal wire 81 is connected to a second metal wire 83 via a first via hole 82, and the second metal wire 83 is connected to a third metal wire 85 via a second via hole 84. Moreover, the gate electrode 77 and the first metal wire 81 are insulated by an intermediate film 86, the first metal wire 81 and the second metal wire 83 are insulated by a first interlayer film 87, and the second metal wire 83 and the third metal wire 85 are insulated by a second interlayer film 88. The present disclosure contemplates that, as illustrated in FIG. 4, as the thickness of the gate insulating film 76 increases, a variation amount of Vt increases suddenly at around 350 Å of film thickness. This sudden increase may result because the Vt variation occurs due to plasma damage caused by a manufacturing process after formation of the first metal wire 81.

Figure 5:
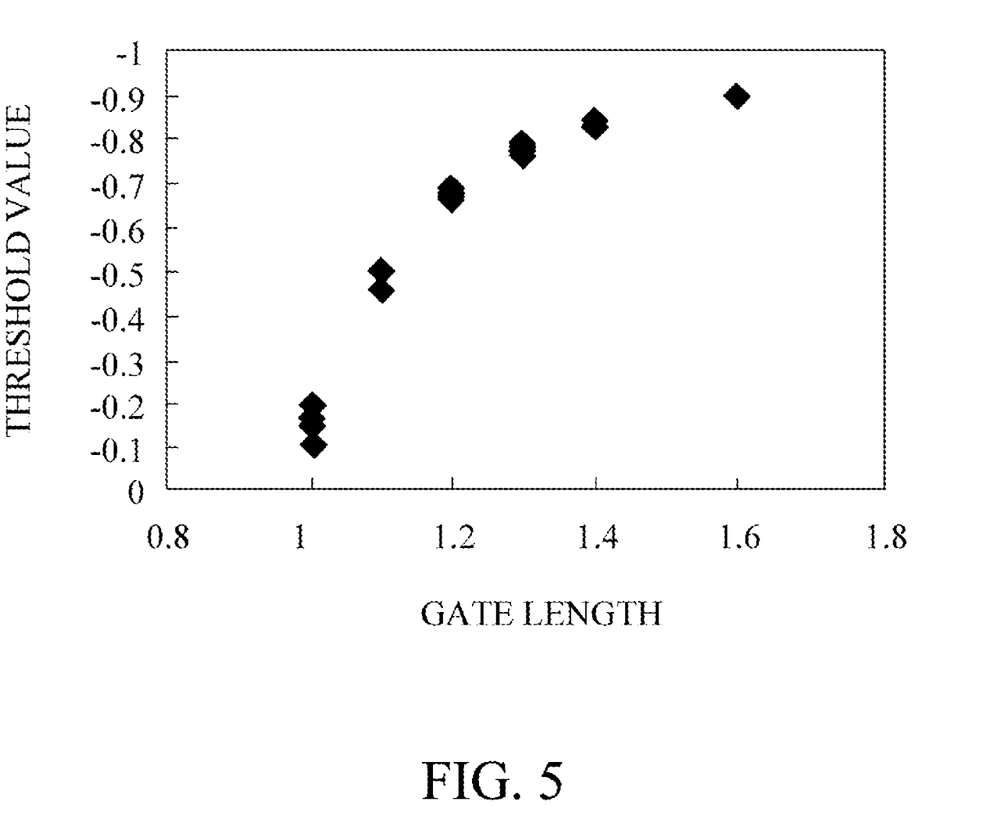
FIG. 5 is a plot of threshold value versus gate length in an exemplary high voltage-resistant semiconductor device.

As illustrated in FIG. 5, in the method of adjusting gate length, as gate length decreases, the threshold value (Vt) suddenly decreases due to a short channel effect, and, thus, it may be difficult to control the threshold valve.

Figure 1A:
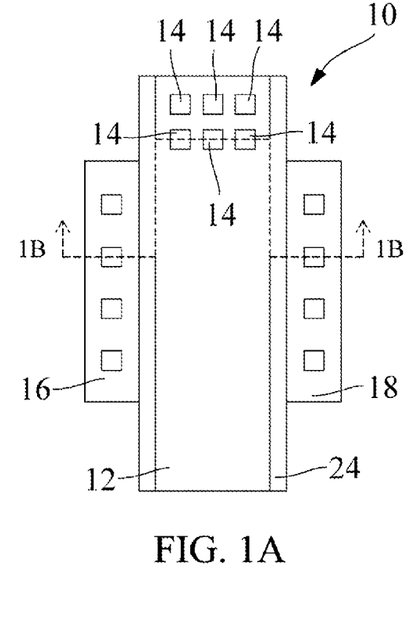
FIG. 1A is a schematic plan view illustrating a portion of an exemplary high voltage-resistant semiconductor device.
Figure 1B:
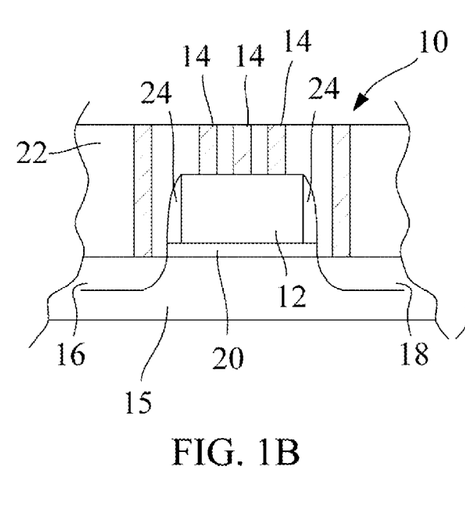
FIG. 1B is a cross-sectional view of the exemplary high voltage-resistant semiconductor device of FIG. 1A.
Figure 1C:
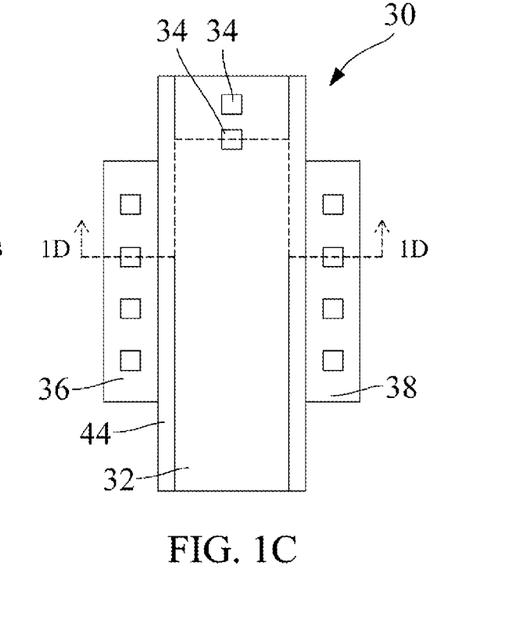
FIG. 1C is a schematic plan view illustrating a portion of an exemplary high voltage-resistant semiconductor device.
Figure 1D:
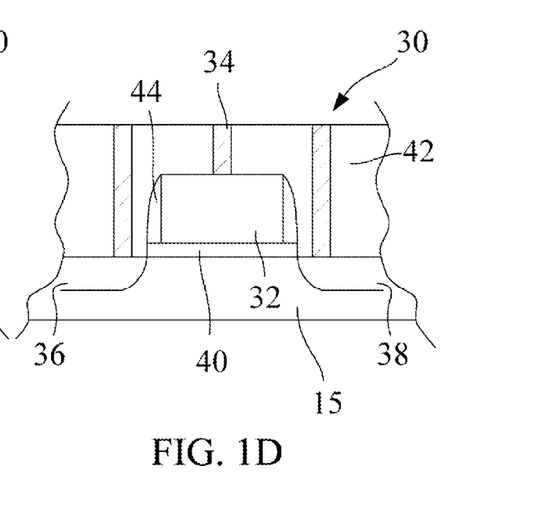
FIG. 1D is a cross-sectional view of the exemplary high voltage-resistant semiconductor device FIG. 1C.

FIG. 1A is a top schematic diagram illustrating a portion of an exemplary high voltage-resistant semiconductor device, FIG. 1B is an 1B-1B cross-sectional diagram of FIG. 1A, FIG. 1C is a top schematic diagram illustrating a portion of an exemplary high voltage-resistant semiconductor device, and FIG. 1D is an 1D-1D cross-sectional diagram of FIG. 1C. FIGS. 1A and 1C illustrate transistors that are provided on the same silicon semiconductor substrate 15 and that have Vts different from each other.

Figure 2:
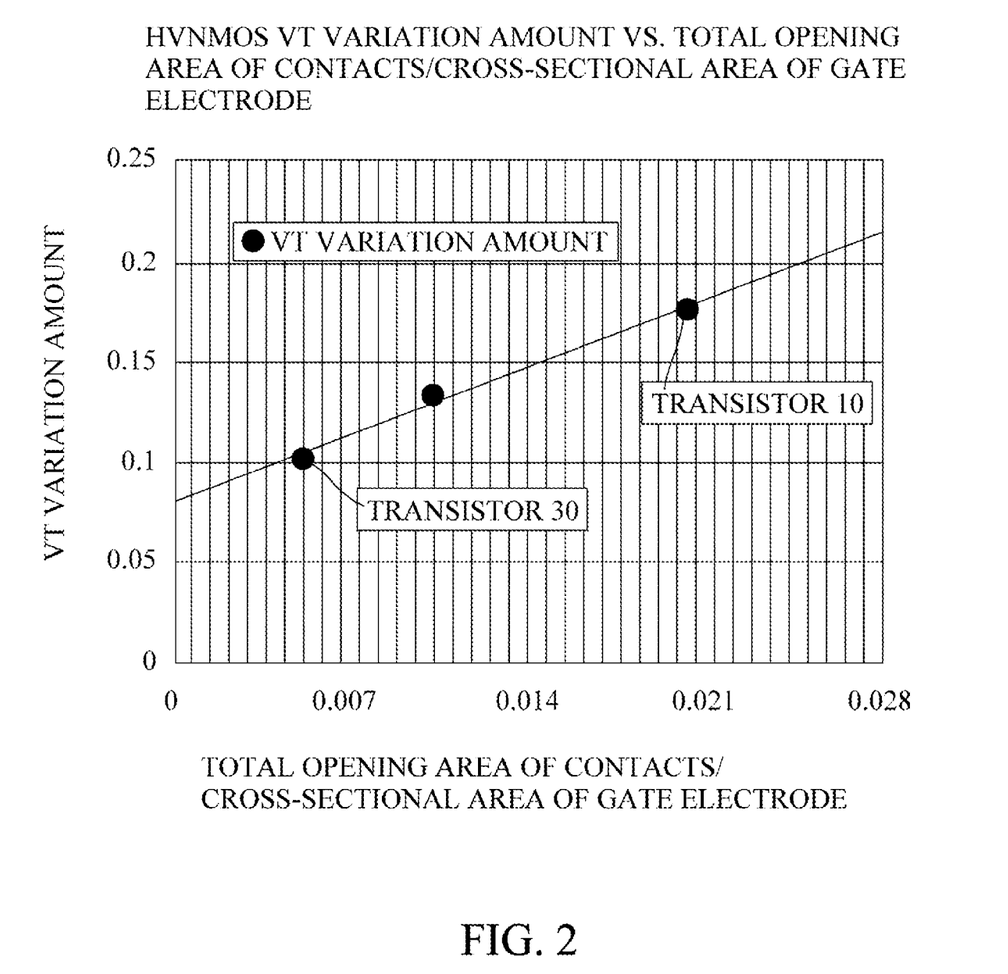
FIG. 2 is a plot of threshold voltage variation versus total opening area of contacts/cross-sectional area of a gate electrodes in an exemplary high voltage-resistant semiconductor device.

An exemplary transistor 10 illustrated in FIG. 1A has six contacts 14 formed therein, and an exemplary transistor 30 illustrated in FIG. 1C has two contacts 34 formed therein. Therefore, plasma damage inflicted on the gate insulating film 20 in FIG. 1B is larger than plasma damage inflicted on the gate insulating film 40 in FIG. 1D. Therefore, a Vt variation amount in the transistor 10 is larger than that in the transistor 30. Specifically, as illustrated in FIG. 2, the Vt variation amount in the transistor 30 is around 0.1V, but the Vt variation amount in the transistor 10 is larger than that in the transistor 30, and is around 0.175V. Therefore, in the transistor 10, the Vt is relatively low and the operation speed becomes high. The present disclosure contemplates that when a transistor has a low Vt and high operation speed, leakage currents within the transistor are also increased. However, the transistor 10 according to the present disclosure includes a number of contacts 14 provided therein. Therefore, since electric currents that are originally leaked flow into the contacts 14, the leakage currents can be restrained. Moreover, as illustrated in FIG. 2, the ratio Sc/Sg, which is the ratio of the total opening area Sc of the contacts with respect to the area Sg in which the gate electrode 12 is in contact with the gate insulating film 20, and the Vt variation amount are proportional to each other. In other words, it is possible to easily estimate an area of contacts (which is associated with the number of the contacts) for obtaining a desired Vt. The ratio Sc/Sg is further described below.

Moreover, an exemplary high voltage-resistant semiconductor device according to the present disclosure may include a plurality of transistors showing Vts different from one another. In other words, the previously-described area ratio (Sc/Sg) may be different among the transistors. If these differences are minute and are within an error range, it may appear as though the high voltage-resistant semiconductor device includes a plurality of transistors having the same Vt. In some exemplary high voltage-resistant semiconductor devices according to the present disclosure, the differences of the area ratios in the plurality of MOS transistors may be greater than about 10% in comparison with an average of area ratios in all the MOS transistors.

As used herein, "total opening area" is the sum of the horizontal opening areas of contacts formed on one gate electrode. For example, as illustrated in FIG. 1A, when six contacts 14 are formed on the gate electrode 12, the sum of all six opening areas of the six contacts 14 corresponds to "the total opening area" Sc. If, for example, only one contact exists, its opening area corresponds to "the total opening area."

The "contact area between the gate electrode and the gate insulating film" is the area of a gate electrode 12 illustrated in FIG. 1A. As shown in FIG. 1B, the gate electrode 12 and side walls 24 are provided on a gate insulating film 20, and the contact area Sg is the area between the gate insulating film 20 and the gate electrode 12.

Here, "a difference of the area ratios" expresses the difference between the area ratio (Sc/Sg) of one transistor and the average of the area ratios of transistors in the high voltage-resistant semiconductor device. In some exemplary embodiments, when the difference between area ratios is greater than about 10%, the transistors show Vts different from each other, and the high voltage-resistant semiconductor device may be driven as a semiconductor device in which an analog circuit and a digital circuit are placed together.

Exemplary high voltage-resistant semiconductor devices according to the present disclosure may include transistors with at least two different Vts. For example, when three transistors are provided, two transistors may show the same Vt and one transistor may show a different Vt, or all three transistors may show three different Vts.

In addition, the Vt variation amount may be controlled by the area ratio for the contacts on the gate electrode as illustrated in FIG. 2, and the Vt variation amount may be influenced by plasma damage resulting from forming a first via when a transistor has a multilayer wiring structure as illustrated in FIG. 3. Therefore, when a transistor in an exemplary high voltage-resistant semiconductor device according to the present disclosure has a multilayer wiring structure, Vt may be assumed in consideration of a cross-sectional area for the first via.

Hereinafter, a contact, a gate insulating film, and other elements that may comprise an exemplary high voltage-resistant semiconductor device according to the present disclosure will be described in detail.

In some exemplary embodiments, a contact may have the same shape (or a similar shape) as that of contacts formed on a source region 16 and a drain region 18, and this may be advantageous from the viewpoint of manufacturing efficiency. Moreover, from the viewpoint of a plasma etching time, it may be advantageous for a cross-sectional area to be not more than about 0.16 $\mu m^2$ in some exemplary embodiments.

In some exemplary embodiments, a contact hole may be formed by plasma etching, for example. The plasma etching may be accomplished using an etching gas, such as mixed gas of CF series gas such as $CF_4$, $C_4F_8$, $C_5F_8$, or $CHF_3$, Ar, and $O_2$. Formation of various contact holes may be performed in a similar fashion for the first via and subsequent vias when a transistor has a multilayer wiring structure.

In some exemplary embodiments, an oxide film (such as $SiO_2$ or an oxynitride) may be used as a gate insulating film. In some exemplary embodiments, metals such as poly-Si (polycrystalline silicon), WSiX (tungsten silicide), or W (tungsten) may be used as gate electrodes. In some exemplary embodiments, metals such as Poly-Si, Al (aluminum), W, or Cu (copper) may be used as contacts. A material the same as or similar to that of a contact may be used for the first via and subsequent vias when a transistor has a multilayer wiring structure. Moreover, in some exemplary embodiments, an alloy such as an Al—Cu alloy, Al—Cu—Si, or Cu may be used as a metal wire. In some exemplary embodiments, an oxide such as $SiO_2$ (silicon dioxide) may be used as an intermediate film 22 or an interlayer film used in a multilayer wiring structure.

FIG. 4 shows that a Vt variation amount suddenly increases when the film thickness of a gate insulating film exceeds about 350 Å. In other words, when the film thickness of the gate insulating film exceeds about 350 Å, a Vt variation occurs due to plasma damage. Exemplary embodiments according to the present disclosure may be advantageous where, for example, the film thickness of the gate insulating film exceeds about 350 Å.

In an exemplary high voltage-resistant semiconductor device according to the present disclosure, since a transistor with a large total opening area has large plasma damage inflicted on the gate insulating film, the variation amount of Vt is large. On the other hand, a transistor with a small total opening area has small plasma damage inflicted on the gate insulating film. Therefore, a semiconductor device including a plurality of transistors having different Vts may be provided. Moreover, since the transistor with the large total opening area has large plasma damage inflicted on the gate insulating film, the Vt is small. In other words, the transistor performs a high-speed operation, but has large leakage currents. However, cross-sectional areas of portions being conducted to layers between wiring layers are large because the total opening area is large, in other words, it is possible to restrain the leakage currents to flow predetermined electric currents into the wiring layers because electric resistance is low. On the other hand, in the transistor with the small total opening area, an operation speed is low but leakage currents are small. Therefore, it may be possible to reduce electric power consumed by the high voltage-resistant semiconductor device by including transistors having various Vts.

An exemplary method of manufacturing a high voltage-resistant semiconductor device according to the present disclosure may include preparing a silicon substrate having a plurality of transistor forming regions, forming channel regions in a superficial layer region on the transistor forming regions of the semiconductor substrate, forming gate insulating films having a film thickness not less than about 350 Å on the channel regions, forming gate electrodes on the gate insulating films, and forming source regions and drain regions on both sides of the channel regions, to provide a plurality of transistors, providing contacts on the gate electrodes of the plurality of transistors in order that area ratios between areas Sg, in which the gate electrodes are in contact with the gate insulating films, and total opening areas Sc of the contacts formed on the gate electrodes when being seen from the gate electrode sides are different from one another, and providing multilayer wiring on the contacts. Hereinafter, each exemplary process will be described in detail.

A semiconductor substrate having a plurality of MOS transistor forming regions may be prepared in a superficial layer region of the semiconductor substrate. Here, the plurality of MOS transistor forming regions may be formed on different regions that are not overlapped with one another. In some exemplary embodiments, the MOS transistor forming regions are not particularly limited if they are separated such that function as a MOS transistor can be shown.

The following process is an exemplary process for providing predetermined transistors on the MOS transistor forming regions. First, the channel regions may be formed using of an implant technique, the gate insulating films having a film thickness not less than about 350 Å may be formed by means of thermal oxidation thereon, and the gate electrodes may be formed on the gate insulating films. Subsequently, the source regions and the drain regions are formed on both sides of the channel regions by the implant technique, in order to form the MOS transistors.

A contact may be formed by covering a transistor with an intermediate film which may include an insulating material, covering portions other than places for forming a contact hole with a mask, and forming the contact hole using plasma etching. Subsequently, after removing the mask, the contact may be provided by filling the contact hole with metal (such as Al) and smoothing its surface with CMP (chemical-mechanical planarization/polishing) and the like.

As illustrated in FIGS. 1A to 1D, contacts may be formed such that two transistors have different numbers of contacts on the left and right sides. In other words, a ratio of a cross-sectional area of a contact to an area of a gate electrode may be different in two transistors. Therefore, in such a case, since the plasma damage inflicted on the gate insulating films is different from each other, transistors having different threshold values can be formed.

By forming contacts in this way, it is possible to provide transistors showing a plurality of Vts without the necessity of adjusting gate length and additionally without the necessity of adjusting impurity concentration of a source region and a drain region.

Further, in order to provide a multilayer wiring substrate, a first wiring layer may be formed on the contact, the first wiring layer may be covered by a first interlayer film, and a first via may be provided similarly to the previously-described contact formation. Similarly, second and third wiring layers may be formed.

The exemplary high voltage-resistant semiconductor devices and the exemplary manufacturing methods thereof according to the present disclosure as described above are not to interpreted in a limited way. While exemplary embodiments have been set forth above for the purpose of disclosure, modifications of the disclosed embodiments as well as other embodiments thereof may occur to those skilled in the art. Accordingly, it is to be understood that the disclosure is not limited to the above precise embodiments and that changes may be made without departing from the scope. Likewise, it is to be understood that it is not necessary to meet any or all of the stated advantages or objects disclosed herein to fall within the scope of the disclosure, since inherent and/or unforeseen advantages of the may exist even though they may not have been explicitly discussed herein.

What is claimed is:

1. A high voltage-resistant semiconductor device comprising:
    a plurality of metal-oxide-semiconductor transistors on a silicon substrate, each of the plurality of transistors including
        (a) a gate insulating film having a thickness greater than about 350 Å,
        (b) at least one gate electrode over the gate insulating film, and
        (c) at least one contact formed over the at least one gate electrode;
    wherein a respective area ratio, Sc/Sg, is associated with each of the plurality of transistors, where Sc is a total opening area of the at least one contact formed on the at least one gate electrode of the respective transistor when viewed from a gate electrode side of the respective transistor, and where Sg is a contact area between the at least one gate electrode and the gate insulating film of the respective transistor; and
    wherein at least two of the plurality of transistors are associated with different area ratios.

2. The high voltage-resistant semiconductor device of claim 1, wherein a difference between the area ratio, Sc/Sg, associated with each of the plurality of transistors and an average of all of the area ratios, Sc/Sg, associated with all of the plurality of transistors exceeds about 10%.

3. The high voltage-resistant semiconductor device of claim 1, wherein at least one of the contacts formed over the gate electrode has a shape substantially similar to at least one of a source contact formed on a source region and a drain contact formed on a drain region.

4. The high voltage-resistant semiconductor device of claim 1, wherein at least one of the contacts has a cross-sectional area of less than about 0.16 μm2.

5. The high voltage-resistant semiconductor device of claim 1, wherein the gate insulating film includes at least one of SiO2 and an oxynitride.

6. The high voltage-resistant semiconductor device of claim 1, wherein at least one of the gate electrodes includes at least one of poly-Si, WSiX, and W.

7. The high voltage-resistant semiconductor device of claim 1, wherein at least one of the contacts includes at least one of poly-Si, Al, W, and Cu.

8. The high voltage-resistant semiconductor device of claim 1, further comprising a wire including at least one of an Al—Cu alloy, Al—Cu—Si, and Cu, and an intermediate film including SiO2.

9. A high voltage-resistant semiconductor device comprising:
    a plurality of metal-oxide-semiconductor transistors on a silicon substrate, each of the plurality of transistors including
        (a) a gate insulating film having a thickness greater than a thickness of the gate insulating film in which a threshold voltage variation amount substantially increases with respect to lower thicknesses,
        (b) at least one gate electrode over the gate insulating film, and (c) at least one contact formed over the at least one gate electrode;

wherein a respective area ratio, Sc/Sg, is associated with each of the plurality of transistors, where Sc is a total opening area of the at least one contact formed on the at least one gate electrode of the respective transistor when viewed from a gate electrode side of the respective transistor, and where Sg is a contact area between the at least one gate electrode and the gate insulating film of the respective transistor; and wherein at least two of the plurality of transistors are associated with different area ratios.

10. The high voltage-resistant semiconductor device of claim 9, wherein a difference between the area ratio, Sc/Sg, associated with each of the plurality of transistors and an average of all of the area ratios, Sc/Sg, associated with all of the plurality of transistors exceeds about 10%.

11. The high voltage-resistant semiconductor device of claim 9, wherein at least one of the contacts formed over the gate electrode has a shape substantially similar to at least one of a source contact formed on a source region and a drain contact formed on a drain region.

12. The high voltage-resistant semiconductor device of claim 9, wherein at least one of the contacts has a cross-sectional area of less than about 0.16 µm2.

13. The high voltage-resistant semiconductor device of claim 9, wherein at least one of the contacts includes at least one of poly-Si, Al, W, and Cu.

14. The high voltage-resistant semiconductor device of claim 9, further comprising a wire including at least one of an Al—Cu alloy, Al—Cu—Si, and Cu, and an intermediate film including SiO2.

15. The high voltage-resistant semiconductor device of claim 9, wherein the thickness of the gate insulating film is greater than about 350 Å.

* * * * *